(12) United States Patent
Xu

(10) Patent No.: US 9,590,608 B2
(45) Date of Patent: Mar. 7, 2017

(54) BOOTSTRAP REFRESH CONTROL CIRCUIT, VOLTAGE CONVERTER AND ASSOCIATED METHOD

(71) Applicant: Chengdu Monolithic Power Systems Co., Ltd., Chengdu (CN)

(72) Inventor: Li Xu, Chengdu (CN)

(73) Assignee: CHENGDU MONOLITHIC POWER SYSTEMS CO., LTD., Chengdu (CN)

( * ) Notice: Subject to any disclaimer, the term of this patent is extended or adjusted under 35 U.S.C. 154(b) by 13 days.

(21) Appl. No.: 14/823,900

(22) Filed: Aug. 11, 2015

(65) Prior Publication Data

US 2016/0043642 A1 Feb. 11, 2016

(30) Foreign Application Priority Data

Aug. 11, 2014 (CN) .......................... 2014 1 0390708

(51) Int. Cl.
| | |
|---|---|
| *H02M 3/156* | (2006.01) |
| *H03K 17/06* | (2006.01) |
| *H02M 1/08* | (2006.01) |
| *H02M 3/158* | (2006.01) |

(52) U.S. Cl.
CPC ............ *H03K 17/063* (2013.01); *H02M 1/08* (2013.01); *H02M 3/1588* (2013.01); *H03K 2217/0081* (2013.01)

(58) Field of Classification Search
CPC .... H02M 3/156; H02M 3/155; H02M 3/1582; H02M 3/1588; H02M 3/157; H02M 3/158; H02M 1/08; H03K 17/063; H03K 2217/0081

USPC ................. 323/222, 282–285, 351
See application file for complete search history.

(56) References Cited

U.S. PATENT DOCUMENTS

| | | | | |
|---|---|---|---|---|
| 5,365,118 | A * | 11/1994 | Wilcox | H02M 1/38 327/109 |
| 5,705,919 | A * | 1/1998 | Wilcox | G05F 1/618 323/268 |
| 6,396,251 | B2 * | 5/2002 | Corva | H02M 3/1588 323/283 |
| 6,456,050 | B1 * | 9/2002 | Agiman | H02M 3/1563 323/282 |
| 9,312,773 | B2 * | 4/2016 | Li | H02M 3/1588 |
| 2005/0231177 | A1 * | 10/2005 | Tateno | H02M 3/1588 323/225 |
| 2010/0001704 | A1 * | 1/2010 | Williams | H02M 3/158 323/283 |
| 2010/0315055 | A1 * | 12/2010 | Miyazaki | H02M 1/12 323/283 |

(Continued)

*Primary Examiner* — Adolf Berhane

(57) ABSTRACT

A voltage converter having a bootstrap refresh control circuit and a method for controlling the voltage converter. The bootstrap refresh control circuit monitors a bootstrap voltage across a bootstrap capacitor and provides a high side driving signal to a high side switch of the voltage converter. The bootstrap refresh control circuit also controls the charging of the bootstrap capacitor through decreasing the output voltage of the voltage converter once the bootstrap voltage is dropped to be smaller than a bootstrap refresh threshold. When the output voltage of the voltage converter is decreased enough, the bootstrap refresh control circuit switches the high side switch and the low side switch on and off to refresh the bootstrap voltage.

16 Claims, 6 Drawing Sheets

(56) References Cited

U.S. PATENT DOCUMENTS

| | | | |
|---|---|---|---|
| 2011/0127975 A1* | 6/2011 | Hosokawa | H02M 3/1588 323/271 |
| 2012/0049829 A1* | 3/2012 | Murakami | H02M 1/32 323/288 |
| 2013/0328540 A1* | 12/2013 | Kung | H02M 3/158 323/311 |
| 2015/0008890 A1* | 1/2015 | Sasao | H02M 1/08 323/271 |
| 2015/0042298 A1* | 2/2015 | Kung | H02M 3/1588 323/271 |
| 2015/0061611 A1 | 3/2015 | Li | |
| 2016/0065072 A1* | 3/2016 | Xiu | H02M 1/08 323/271 |
| 2016/0105175 A1* | 4/2016 | Ishimatsu | H03K 17/162 327/109 |
| 2016/0221332 A1* | 8/2016 | Sano | B41J 2/04541 |

* cited by examiner

BOOTSTRAP REFRESH CONTROL CIRCUIT, VOLTAGE CONVERTER AND ASSOCIATED METHOD

CROSS-REFERENCE TO RELATED APPLICATION(S)

This application claims the benefit of CN application No. 201410390708.2 filed on Aug. 11, 2014 and incorporated herein by reference.

TECHNICAL FIELD

This disclosure relates generally to electronic circuits, and more particularly but not exclusively relates to voltage converters and bootstrap refresh control circuit and associated method.

BACKGROUND

Power converters such as switch-mode voltage regulators are widely used in various electronic devices. In the presently existing switch-mode voltage regulators, a high voltage signal may be needed to drive the switches. So a bootstrap circuit will be applied to provide the high voltage signal.

FIG. 1 illustrates schematically a voltage converter 50. As shown in FIG. 1, the voltage converter 50 comprises a switching circuit 51 and a control circuit 52.

The switching circuit 51 may comprise a high side switch 11, a low side switch 12, an inductor (L), a capacitor (C) and a load (R). The high side switch 11 and the low side switch 12 have a source, a drain and a gate respectively. The high side switch 11 and the low side switch 12 may comprise a power switching device, such as a Metal Oxide Semiconductor Field Effect Transistor (MOSFET), a Junction Field Effect Transistor (JFET) etc. The drain of the high side switch 11 is coupled to an input terminal (IN) of the voltage converter 50 for receiving an input voltage (VIN). The source of the high side switch 11 is coupled to the drain of the low side switch 12 so as to constitute a common connection node (SW). The source of the low side switch 12 is connected to a logic ground. The inductor (L) is coupled between the common connection node (SW) and an output terminal (OUT) of the voltage converter 50. The capacitor (C) and the load (R) are connected in parallel between the output terminal (OUT) of the voltage converter 50 and the logic ground.

The control circuit 52 is coupled to the output terminal (OUT) of the voltage converter 50 for receiving a feedback signal FB representing an output voltage signal (VOUT) of the voltage converter 50, and configured to generate a first control signal (SH) and a second control signal (SL) to switch the high side switch 11 and the low side switch 12 on and off in a complementary manner. In one embodiment, the control circuit 52 may comprise a Pulse-Width Modulation (PWM) control circuit, wherein the PWM control circuit is configured to regulate the output voltage signal (VOUT) by providing a plurality of square pulse signals with different duty cycle.

In the embodiment as shown in FIG. 1, the control circuit 52 may further comprise a driver configured to drive the high side switch 11 and the low side switch 12. During positive energy storage on the inductor (L), the driver may pull up the voltage of the gate of the high side switch 11. In such application, in order to make the high side switch 11 to be fully turned on (i.e. to make the high side switch 11 to operate in saturation region in which the switch 11 has a quite small on resistance), a voltage applied between the gate of the high side switch 11 and a terminal connected to the common connection node SW of the high side switch 11 must be large enough, at least larger than a conduction threshold voltage of the switch 11. However, when the high side switch 11 is on, the voltage at the common connection node (SW) can reach the input voltage (VIN), and thus a voltage higher than the input voltage (VIN) must be provided to the gate of the high side switch 11 so as to turn it on completely.

Therefore, in order to generate a voltage higher than the input voltage (VIN), the voltage converter 50 generally further comprises a bootstrap circuit 53. The bootstrap circuit 53 is configured to provide a bootstrap voltage (VBST) referenced to the common connection node (SW). The bootstrap voltage (VBST) can be used to enhance the driving capability of the first control signal (SH) provided to the gate of the high side switch 11, so that the first control signal (SH) can drive the high side switch 11 to turn on and off in good condition.

In the example of FIG. 1, the bootstrap circuit 53 is illustrated to comprise a diode (DB) and a bootstrap capacitor (CB) connected in series between a bootstrap supply terminal and the common connection node (SW), wherein a cathode of the diode (DB) is connected to the bootstrap supply terminal to receive a bootstrap supply voltage (VB), an anode of the diode (DB) is connected to a first terminal of the bootstrap capacitor (CB) to constitute a common connection node (BST), and a second terminal of the bootstrap capacitor (CB) is connected to the common connection node (SW). The operating principles of the bootstrap circuit 53 can be easily understood by one of ordinary skilled in the art. When the high side switch 11 is turned off and the low side switch 12 is turned on, the voltage of the common connection node (SW) is equal to the ground potential and the bootstrap capacitor (CB) is charged by the bootstrap supply voltage (VB) till the voltage across the bootstrap capacitor (CB) reaches the bootstrap voltage (VBST). When the high side switch 12 is turned on and the low side switch 11 is turned off, the input voltage (VIN) of the voltage converter 50 is transmitted to the common connection node (SW), i.e. the voltage at the second terminal of the bootstrap capacitor (CB) is pulled up to the input voltage (VIN). Thus, the voltage at the common connection node (BST) is raised to a voltage higher than the input voltage (VIN), substantially equal to the input voltage (VIN) plus the bootstrap voltage (VBST). Thus, a voltage higher than the input voltage (VIN) can be obtained in the step-down voltage converter 50. Meanwhile, the diode (DB) is reversely biased and is thus turned off so as to protect the bootstrap supply voltage source (VB) from being damaged by the relatively higher input voltage (VIN).

In view of the above, it can be understood that the bootstrap capacitor (CB) can be charged to refresh the bootstrap voltage (VBST) by pulling down the second terminal of the bootstrap capacitor (CB) to ground potential when the low side switch 12 is turned on. However, in certain circumstances, the bootstrap capacitor (CB) may not have enough charge stored and may not be charged/recharged in time, resulting in the bootstrap voltage (VBST) to be decreased, which may cause the first control signal (SH) unable to drive the high side switch 11 on and off properly. Consequently, the voltage converter 50 can not be operated properly. Or in another situation, the bootstrap voltage (VBST) may drops to a default lock-out threshold value resulting in a lock of the voltage converter 50, which may also cause the voltage converter 50 operating improperly.

For example, when the output voltage signal (VOUT) is approximately close to the input voltage signal (VIN), the high side switch 11 has to operate with a quite high duty cycle, even in a 100% duty cycle. Therefore, the low side switch 12 may have a very short conduction time or hardly have chance to turn on resulting in the bootstrap capacitor (CB) unable to be charged to a desired value.

In another condition, for example, when the voltage converter 50 operates in light load or no load condition, the control circuit 52 is configured to reduce the conduction time and/or the switching frequency of the high side switch 11 and the low side switch 12 to improve the conversion efficiency of the voltage converter 50, which may lead to the bootstrap capacitor (CB) not being able to be charged/recharged in time since the on time of the low side switch 12 is too short or there is no switching in a relatively long time.

Therefore, all the conditions mentioned above can result in drops of the bootstrap voltage (VBST), which in turn causes failure in driving the high side switch 11 on and off properly. Thus, the voltage converter 50 operates in an abnormal condition. In such circumstances, only when the output voltage signal (VOUT) drops low enough after several operation cycles, can the bootstrap capacitor (CB) have the opportunity to be charged to refresh the bootstrap voltage (VBST). However, during such processes, a plurality of large spikes may occur in the output voltage signal (VOUT), which may damage the voltage converter 50 and the load (R). Thus, it is undesirable.

A need therefore exists for solving the problem of refreshing the bootstrap voltage (VBST) timely in voltage converters.

SUMMARY

In one embodiment, the present invention discloses a bootstrap refresh control circuit for a voltage converter, wherein the voltage converter comprises a high side switch, a low side switch and a bootstrap capacitor for providing a bootstrap voltage signal to supply a high side driver of the high side switch, and wherein the voltage converter is configured to receive an input voltage at an input terminal and to provide an output voltage at an output terminal based on driving the high side switch and the low side switch to switch on and off, and wherein the bootstrap refresh control circuit comprising: a bootstrap refresh module, wherein the bootstrap refresh module comprises a first comparing module having a first input terminal, a second input terminal and an output terminal, and wherein the first input terminal of the first comparing module is configured to receive the bootstrap voltage signal, the second input terminal of the first comparing module is configured to receive a bootstrap refresh threshold, and the first comparing module is configured to compare the bootstrap voltage signal with the bootstrap refresh threshold to provide a first comparing signal having a first logic state and a second logic state at the output terminal, and wherein the first comparing signal has the first logic state when the bootstrap voltage signal is lower than the bootstrap refresh threshold, and wherein the first comparing signal has the second logic state when the bootstrap voltage signal is larger than the bootstrap refresh threshold; a voltage difference module having a first input terminal, a second input terminal and an output terminal, wherein the first input terminal of the voltage difference module is configured to receive a feedback signal representing the output voltage of the voltage converter, the second input terminal of the voltage difference module is configured to receive a reference voltage signal representing a desired value of the output voltage of the voltage converter, the voltage difference module is configured to compare the feedback signal with the reference voltage signal so as to provide a difference signal at the output terminal; and wherein when the first comparing signal has the first logic state, the bootstrap refresh module is configured to decrease the output voltage of the voltage converter; and wherein when the feedback signal is smaller than the reference voltage signal, the bootstrap refresh control circuit is configured to control the high side switch and the low side switch to switch on and off based on the difference signal so as to charge the bootstrap capacitor for refreshing the bootstrap voltage signal.

In one embodiment, the present invention discloses a voltage converter, comprising: a switching circuit having a high side switch and a low side switch, wherein the switching circuit is configured to receive an input voltage, and further configured to provide an output voltage based on switching the high side switch and the low side switch on and off; a bootstrap circuit comprising a bootstrap capacitor, wherein the bootstrap capacitor is charged for providing a bootstrap voltage signal for the high side switch; and a bootstrap refresh control circuit comprising a bootstrap refresh module, wherein the bootstrap refresh module comprises a first comparing module having a first input terminal, a second input terminal and an output terminal, and wherein the first input terminal of the first comparing module is configured to receive the bootstrap voltage signal, the second input terminal of the first comparing module is configured to receive a bootstrap refresh threshold, and the first comparing module is configured to compare the bootstrap voltage signal with the bootstrap refresh threshold to provide a first comparing signal having a first logic state and a second logic state at the output terminal, and wherein the first comparing signal has the first logic state when the bootstrap voltage signal is lower than the bootstrap refresh threshold, and the first comparing signal has the second logic state when the bootstrap voltage signal is larger than the bootstrap refresh threshold; and a voltage difference module having a first input terminal, a second input terminal and an output terminal, wherein the first input terminal of the voltage difference module is configured to receive a feedback signal representing the output voltage of the voltage converter, the second input terminal of the voltage difference module is configured to receive a reference voltage signal representing a desired value of the output voltage of the voltage converter, the voltage difference module is configured to compare the feedback signal with the reference voltage signal so as to provide a difference signal at the output terminal; and wherein when the first comparing signal has the first logic state, the bootstrap refresh module is configured to decrease the output voltage of the voltage converter; and wherein when the feedback signal is smaller than the reference voltage signal, the bootstrap refresh control circuit is configured to control the high side switch and the low side switch to switch on and off based on the difference signal so as to charge the bootstrap capacitor for refreshing the bootstrap voltage signal.

In one embodiment, the present invention discloses a bootstrap refresh control method for a voltage converter, wherein the voltage converter comprises a high side switch, a low side switch and a bootstrap capacitor for providing a bootstrap voltage signal to supply a high side driver of the high side switch, and wherein the voltage converter is configured to receive an input voltage and to provide an output voltage based on driving the high side switch and the low side switch to switch on and off, and wherein the bootstrap refresh control method comprising: sensing the bootstrap voltage signal of the voltage converter; comparing the bootstrap voltage with a bootstrap refresh threshold to provide a first comparing signal, wherein the first comparing signal has a first logic state and a second logic state, and wherein the first comparing signal has the first logic state when the bootstrap voltage is lower than the bootstrap refresh threshold, and wherein the first comparing signal has the second logic state when the bootstrap voltage signal is larger than the bootstrap refresh threshold; determining whether the bootstrap voltage signal is smaller than the bootstrap refresh threshold or not; and decreasing the output voltage of the voltage converter by a bootstrap refresh circuit once the bootstrap voltage signal is determined to have dropped to be smaller than the bootstrap refresh threshold; and wherein when the output voltage of the voltage converter is decreased, switching the high side switch and the low side switch on and off so as to refresh the bootstrap voltage signal.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

The use of the same reference label in different drawings indicates the same or like components or structures with substantially the same functions for the sake of simplicity.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1:
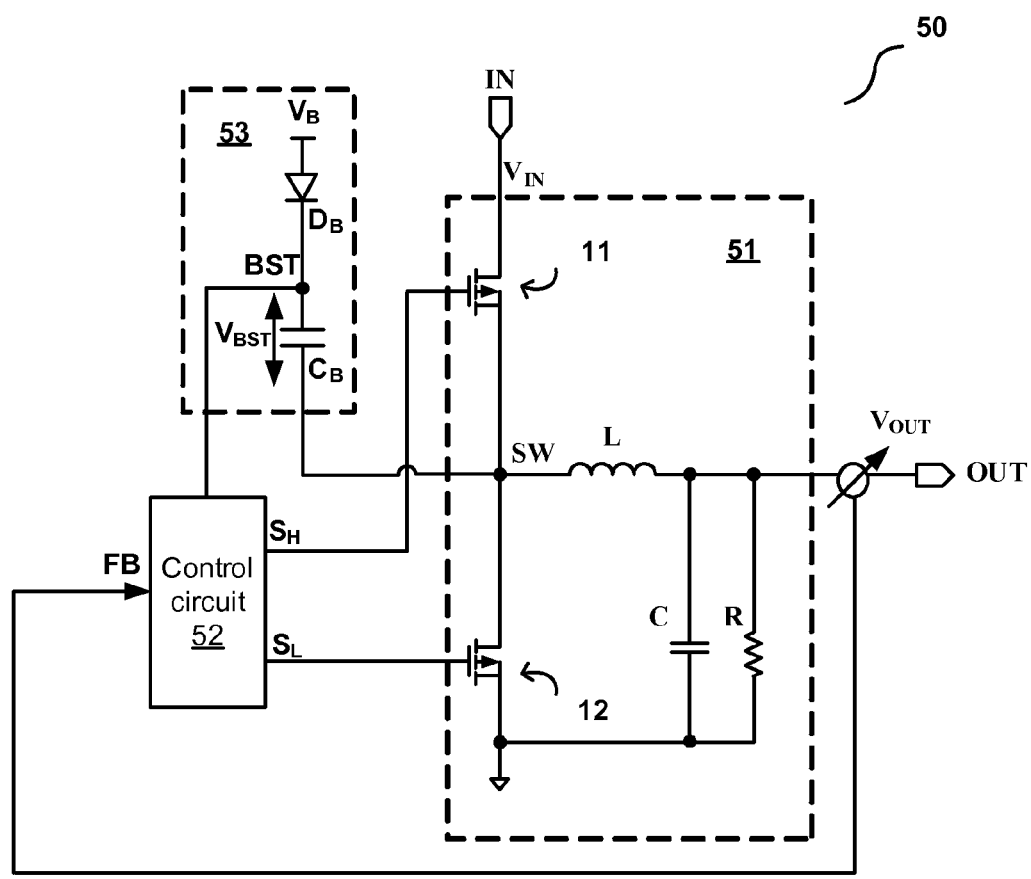
FIG. 1 illustrates a schematic diagram of a typical voltage converter 50.
Figure 2:
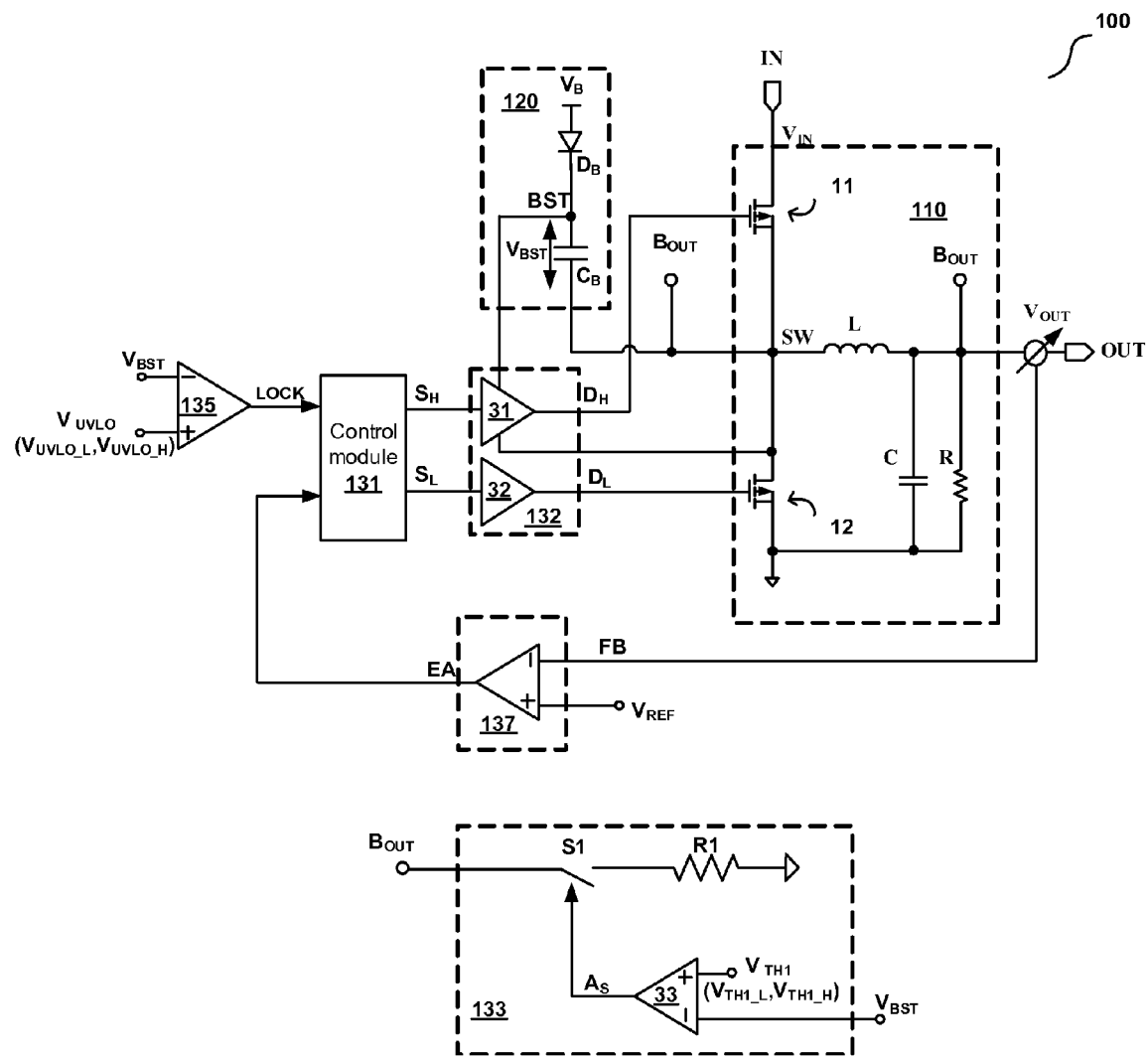
FIG. 2 illustrates a schematic diagram of a voltage converter 100 in accordance with an exemplary embodiment of the present invention.

FIG. 2 illustrates a schematic diagram of a voltage converter 100 in accordance with an exemplary embodiment of the present invention. In one embodiment, the voltage converter 100 may comprise a switching circuit 110, a bootstrap circuit 120 and a bootstrap refresh control circuit.

The switching circuit 110 may comprise a high side switch 11, a low side switch 12, an inductor (L), a capacitor (C) and a load (R). The high side switch 11 and the low side switch 12 may have a source, a drain and a gate respectively. The drain of the high side switch 11 is coupled to an input terminal (IN) of the voltage converter 100 for receiving an input voltage ($V_{IN}$). The source of the high side switch 11 is coupled to the drain of the low side switch 12 so as to constitute a common connection node (SW). The source of the low side switch 12 is connected to a logic ground. The inductor (L) is coupled between the common connection node (SW) and an output terminal (OUT) of the voltage converter 100. The capacitor (C) and the load (R) are connected in parallel between the output terminal (OUT) of the voltage converter 100 and the logic ground. As shown in FIG. 2, the switching circuit 110 is illustrated as a step down BUCK topology. It should be known that in other embodiment the switching circuit 110 may comprise other suitable topologies, such as a BOOST, a FORWAD or a FLYBACK converter etc. Likewise, in FIG. 2, the high side switch 11 and the low side switch 12 are illustrated as MOSFETs. In other embodiment, the high side switch 11 and the low side switch 12 may comprise other suitable semiconductor devices such as JFETs, Insulated Gate Bipolar Translators (IGBTs) or Double Diffusion Metal Oxide Semiconductor (DMOS) etc.

The bootstrap circuit 120 may comprise a diode ($D_B$) and a bootstrap capacitor ($C_B$) connected in series between a bootstrap supply terminal and the common connection node (SW), wherein a cathode of the diode ($D_B$) is connected to the bootstrap supply terminal to receive the bootstrap supply voltage ($V_B$), an anode of the diode ($D_B$) is connected to a first terminal of the bootstrap capacitor ($C_B$) to constitute a common connection node (BST), and a second terminal of the bootstrap capacitor ($C_B$) is connected to the common connection node (SW). When the high side switch 11 is turned off and the low side switch 12 is turned on, the voltage of the common connection node (SW) is equal to the ground potential and the bootstrap capacitor ($C_B$) is charged by a bootstrap supply voltage ($V_B$) till the voltage across the bootstrap capacitor ($C_B$) reaches the bootstrap voltage ($V_{BST}$). When the high side switch 12 is turned on and the low side switch 11 is turned off, the input voltage ($V_{IN}$) of the voltage converter 100 is transmitted to the common connection node (SW), i.e. the voltage at the second terminal of the bootstrap capacitor ($C_B$) is pulled up to the input voltage ($V_{IN}$). Thus, the voltage at the common connection node (BST) is raised to the input voltage ($V_{IN}$) plus the bootstrap voltage ($V_{BST}$). Thus, a voltage higher than the input voltage ($V_{IN}$) can be realized in the step-down voltage converter 100. Meanwhile, the diode ($D_B$) is reversely biased and is thus turned off so as to protect the bootstrap supply voltage source ($V_B$) from being damaged by the relatively higher input voltage ($V_{IN}$).

In one embodiment, the bootstrap refresh control circuit may comprise a voltage difference module 137 having a first input terminal, a second input terminal and an output terminal. The first input terminal of the voltage difference module 137 may be coupled to the output terminal (OUT) of the voltage converter 100, and configured to receive a feedback signal (FB) representing the output voltage signal ($V_{OUT}$). The second input terminal of the voltage difference module 137 may be configured to receive a reference voltage signal ($V_{REF}$) representing a desired value of the output voltage signal ($V_{OUT}$). The voltage difference module 137 is configured to compare the feedback signal (FB) with the reference voltage signal ($V_{REF}$) so as to provide a difference signal (EA) at the output terminal of the voltage difference module 137. In one embodiment, e.g. for voltage converters using current/voltage controlled methods, the voltage difference module 137 may comprise an error amplifier which is configured to amplify a difference of the feedback signal (FB) versus the reference voltage signal ($V_{REF}$) so as to provide an error amplified signal (e.g. labeled with EA in FIG. 2). The error amplified signal (EA) is configured to compare with a ramp signal to generate a Pulse Width Modulation (PWM) signal for switching the high side switch 11 and the low side switch 12 on and off. In another embodiment, e.g. in examples where the voltage converters using COT control methods or other associated methods, the voltage difference module 137 may comprise a voltage comparator which is configured to compare the feedback signal (FB) and the reference voltage signal ($V_{REF}$) so as to provide a high-low voltage signal (e.g. also labeled with EA) for switching the high side switch 11 and the low side switch 12 on and off. For example, when the feedback signal (FB) is lower than the reference voltage signal ($V_{REF}$), the high side switch 11 is turned on while the low side switch 12 is turned off; and when the feedback signal (FB) is larger than the reference voltage signal ($V_{REF}$), the high side switch 11 is turned off while the low side switch 12 is turned on.

In one embodiment of FIG. 2, the bootstrap refresh control circuit further comprises a control module 131. The control module 131 is coupled to the voltage difference module 137 to receive the difference signal (EA), and configured to estimate the load condition so as to provide a first control signal ($S_H$) and a second control signal ($S_L$) for respectively switching the high side switch 11 and the low side switch 12 on and off.

In one embodiment of FIG. 2, the bootstrap refresh control circuit further comprises a driver module 132. The driver module 132 comprises a first driver 31 and a second driver 32. The first driver 31 may comprise an input terminal configured to receive the first control signal ($S_H$), and an output terminal configured to provide a first drive signal ($D_H$) to the gate of the high side switch 11 for switching the high side switch 11 on and off. The first driver 31 further comprises a first supply terminal configured to receive the bootstrap voltage signal ($V_{BST}$), and a second supply terminal connected to the common connection node (SW). The first supply terminal and the second supply terminal are configured to be used to enhance the driving capability of the first drive signal ($D_H$) so as to better switch the high side switch 11 on and off. The second driver 32 may comprise an input terminal configured to receive the second control signal ($S_L$), and an output terminal configured to provide a second drive signal ($D_L$) to the gate of the low side switch 12 for switching the low side switch 12 on and off. In one embodiment of the present invention, the first driver 31 may comprise one or more inverters, and the bootstrap voltage signal ($V_{BST}$) is configured to operate as supply sources of the one or more inverters. Besides, the second driver 32 may also comprise one or more inverters.

In one embodiment, the bootstrap refresh control circuit may further comprise a bootstrap refresh module 133. The bootstrap refresh module 133 is configured to receive a bootstrap voltage signal ($V_{BST}$), and is further configured to compare the bootstrap voltage signal ($V_{BST}$) with a bootstrap refresh threshold ($V_{TH1}$).

In one embodiment, when the voltage converter 100 operates in light load or no load condition, both the high side switch 11 and the low side switch 12 are turned off so that no current flows through the inductor (L), resulting in drop of the bootstrap voltage signal ($V_{BST}$). If the bootstrap voltage signal ($V_{BST}$) drops lower than the bootstrap refresh threshold ($V_{TH1}$), the bootstrap refresh module 133 starts to operate to reduce the output voltage ($V_{OUT}$) of the voltage converter 100. Meanwhile, the feedback signal (FB) is decreased with the drops of the output voltage ($V_{OUT}$). The comparing module 137 may compare the feedback signal (FB) with the reference voltage signal ($V_{REF}$). When the feedback signal (FB) is smaller than the reference voltage signal ($V_{REF}$), the control module 131 may control the high side switch 11 and the low side switch 12 to switch normally based on the difference signal (EA) so as to maintain the output voltage signal ($V_{OUT}$) at a desired value, i.e. the high side switch 11 and the low side switch 12 are recovered from the off states into a complementary conduction states. The conduction time of the low side switch 12 can be increased accompanying the increasing of the switching frequency of the high side switch 11 and the low side switch 12. Thus, the bootstrap capacitor ($C_B$) can be charged in time to refresh the bootstrap voltage signal ($V_{BST}$) to the default value. Decreasing the output voltage ($V_{OUT}$) so as to increase the switching frequency of the high side switch 11 and the low side switch 12 by employing a bootstrap refresh module 133 can avoid using a blanking circuit to blank the high side switch 11. Besides, the control method and the switches sequence will not be affected, i.e. the bootstrap voltage ($V_{BST}$) can be refreshed by a normal switching of the high side switch 11 and low side switch 12.

In one exemplary embodiment of FIG. 2, the bootstrap refresh module 133 may comprise an input terminal and an output terminal ($B_{OUT}$). The input terminal of the bootstrap refresh module 133 is configured to receive the bootstrap voltage signal ($V_{BST}$). The output terminal ($B_{OUT}$) of the bootstrap refresh module 133 is connected to the common connection node (SW) of the switching circuit 110 to decrease the output voltage ($V_{OUT}$). In another embodiment, the output terminal ($B_{OUT}$) of the bootstrap refresh module 133 is connected to the output terminal (OUT) of the voltage converter 100 to decrease the output voltage ($V_{OUT}$). In another embodiment, the output terminal ($B_{OUT}$) of the bootstrap refresh module 133 can be connected to both of the common connection node (SW) and the output terminal (OUT) of the voltage converter 100 simultaneously to decrease the output voltage ($V_{OUT}$) fast.

In one exemplary embodiment of FIG. 2, the bootstrap refresh module 133 may comprise a comparing circuit 33 having a first input terminal, a second input terminal and an output terminal. The first input terminal of the comparing circuit 33 is configured to receive the bootstrap voltage signal ($V_{BST}$). The second input terminal of the comparing circuit 33 is configured to receive the bootstrap refresh threshold ($V_{TH1}$). The comparing circuit 33 is configured to compare the bootstrap voltage signal ($V_{BST}$) with the bootstrap refresh threshold ($V_{TH1}$) so as to provide a first comparing signal ($A_S$) having a first logic state and a second logic state at the output terminal. In one embodiment, when the bootstrap voltage signal ($V_{BST}$) is smaller than the bootstrap refresh threshold ($V_{TH1}$), the first comparing signal ($A_S$) may have a first logic state (e.g. logic high state). When the bootstrap voltage signal ($V_{BST}$) is larger than the bootstrap refresh threshold ($V_{TH1}$), the first comparing signal ($A_S$) may have a second logic state (e.g. logic low state). In one embodiment, the comparing circuit 33 may comprise a hysteresis comparator, wherein the bootstrap refresh threshold ($V_{TH1}$) comprises a first threshold ($V_{TH1\_L}$) and a second threshold ($V_{TH1\_H}$), and wherein the first threshold ($V_{TH1\_L}$) is higher than a ground potential and lower than the second threshold ($V_{TH1\_H}$), and wherein the first comparing signal ($A_S$) has the first logic state when the bootstrap voltage signal is lower than the first threshold ($V_{TH1\_L}$), and wherein the first comparing signal ($A_S$) has the second logic state when the bootstrap voltage signal is larger than the second threshold ($V_{TH1\_H}$).

In one exemplary embodiment of FIG. 2, the bootstrap refresh module 133 may further comprise a switch (S1) and a resistor (R1). The switch (S1) has a first terminal, a second terminal and a control terminal. The first terminal of the switch (S1) is connected to one terminal of the resistor (R1). The second terminal of the switch (S1) is operated as the output terminal ($B_{OUT}$) of the bootstrap refresh module 133. The control terminal of the switch (S1) is coupled to the output terminal of the comparing circuit 33 to receive the first comparing signal ($A_S$). The other terminal of the resistor (R1) is connected to the logic ground. In one embodiment, when the first comparing signal ($A_S$) has the first logic state, the switch (S1) is turned on so as to connect the resistor (R1) to the common connection node (SW) and/or the output terminal (OUT) of the voltage converter 100 for decreasing the output voltage ($V_{OUT}$) of the voltage converter 100, i.e. the output voltage ($V_{OUT}$) can be decreased due to output capacitor (C) is discharged via the switch (S1) and the resistor (R1). When the first comparing signal ($A_S$) has the second logic state, the switch (S1) is turned off for separating the resistor (R1) from the common connection node (SW) and/or the output terminal (OUT) of the voltage converter 100. In other embodiment, the resistor (R1) can be replaced with a current sink.

In one exemplary embodiment of FIG. 2, the bootstrap refresh control circuit may further comprise an under voltage lock out module 135 having a first input terminal, a second input terminal and an output terminal. The first input terminal of the under voltage lock out module 135 is configured to receive the bootstrap voltage signal ($V_{BST}$). The second input terminal of the under voltage lock out module 135 is configured to receive an under voltage lock out threshold ($V_{UVLO}$). The under voltage lock out module 135 is configured to compare the bootstrap voltage signal ($V_{BST}$) with the under voltage lock out threshold ($V_{UVLO}$) so as to provide a bootstrap under voltage signal (LOCK) with a first logic state and a second logic state at the output terminal to the control module 131. When the bootstrap voltage signal ($V_{BST}$) is smaller than the under voltage lock out threshold ($V_{UVLO}$), the bootstrap under voltage signal (LOCK) may have a first logic state (e.g. logic high state) so as to protect the high side switch 11 and the low side switch 12 from switching on and off (e.g., turn both of the high side switch 11 and the low side switch 12 off). When the bootstrap voltage signal ($V_{BST}$) is larger than the under voltage lock out threshold ($V_{UVLO}$), the bootstrap under voltage signal (LOCK) may have a second logic state (e.g. logic low state) resulting that the high side switch 11 and the low side switch 12 can be switched on and off based on the difference signal (EA). In one embodiment of the present invention, the under voltage lock out threshold ($V_{UVLO}$) is lower than the bootstrap refresh threshold ($V_{TH1}$). The under voltage lock in module 135 is configured to improve the safety performance of the voltage converter 100 by turning the high side switch 11 and the low side switch 12 off once the bootstrap voltage signal ($V_{BST}$) drops lower than the under voltage lock out threshold ($V_{UVLO}$) and/or the bootstrap voltage signal ($V_{BST}$) can not be refreshed in time. In one embodiment, the under voltage lock out module 135 may comprise a hysteresis comparator, wherein the under voltage lock out threshold ($V_{UVLO}$) comprises a third threshold ($V_{UVLO\_L}$) and a fourth threshold ($V_{UVLO\_H}$), and wherein the third threshold ($V_{UVLO\_L}$) is higher than a ground potential and lower than fourth threshold ($V_{UVLO\_H}$), and wherein the bootstrap under voltage signal (LOCK) has the first logic state when the bootstrap voltage signal is lower than the third threshold ($V_{UVLO\_L}$), and wherein the bootstrap under voltage signal (LOCK) has the second logic state when the bootstrap voltage signal is larger than the fourth threshold ($V_{UVLO\_H}$).

Figure 3:
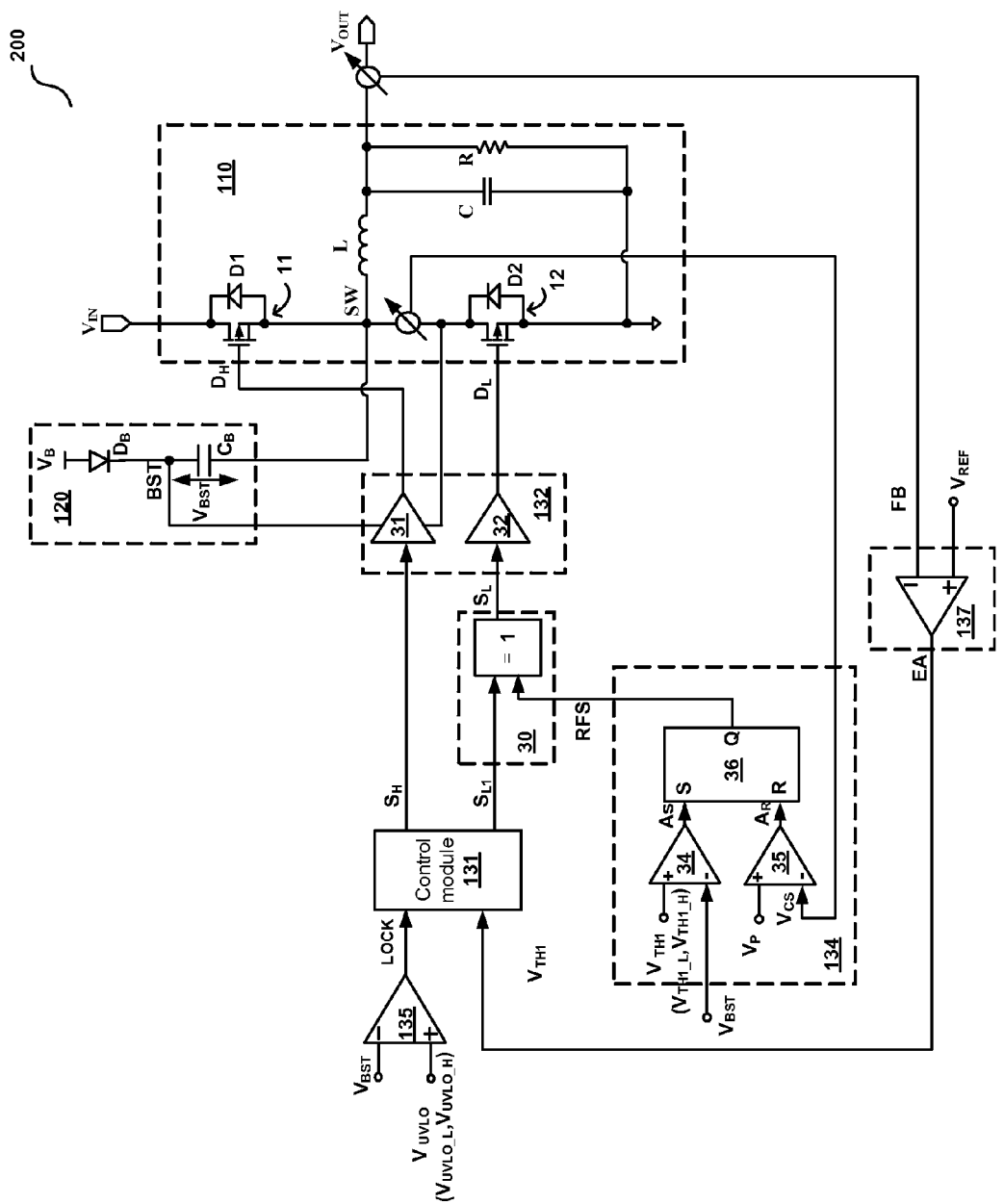
FIG. 3 illustrates a schematic diagram of a voltage converter 200 in accordance with an alternative exemplary embodiment of the present invention.

FIG. 3 illustrates a schematic diagram of a voltage converter 200 in accordance with an exemplary embodiment of the present invention. In one embodiment, the voltage converter 200 also comprises a switching circuit 110, a bootstrap circuit 120 and a bootstrap refresh control circuit. To simple and easy to understand, the components or structures in the voltage converter 200 shown in FIG. 3 with substantially same or similar functions as those of the voltage converter 100 shown in FIG. 2 are identified by the same reference labels. Meanwhile, in the exemplary embodiment of the present invention in FIG. 3, both the high side witch 11 and the low side switch 12 are illustrated with a body diode. Specifically, a body diode D1 is illustrated between the source and drain of the high side switch 11, and a body diode D2 is illustrated between the source and drain of the high side witch 12. In FIG. 3, the high side switch 11 and the low side switch 12 are illustrated as a MOSFET, it should be understood that, the high side switch 11 and the low side switch 12 may comprise other suitable semiconductor devices such as a JFET, IGBT or DMOS etc.

In the exemplary embodiment of the present invention in FIG. 3, the bootstrap refresh control circuit of the voltage converter 200 may comprise a control module 131, a drive module 132, a voltage difference module 137, a bootstrap refresh module 134 and an under voltage lock out module 135. The control module 131, the drive module 132, the voltage difference module 137 and the under voltage lock out 135 of the voltage converter 200 are same as those of the voltage converter 100 in FIG. 2. Therefore, same components or structures will no longer be described again for the sake of simplicity.

In one embodiment of FIG. 3, the bootstrap refresh module 134 may comprise a first input terminal and an output terminal. The first input terminal of the bootstrap refresh module 134 is coupled to the bootstrap circuit 120 to receive a bootstrap voltage signal ($V_{BST}$). The bootstrap refresh module 134 is configured to compare the bootstrap voltage signal ($V_{BST}$) with a bootstrap refresh threshold ($V_{TH1}$) for providing an bootstrap refresh signal (RFS). In one embodiment, when the voltage converter 200 operates in light load or no load condition, both the high side switch 11 and the low side switch 12 are turned off so that no current flows through the inductor (L) and the bootstrap voltage signal ($V_{BST}$) drops. If the bootstrap voltage signal ($V_{BST}$) drops lower than the bootstrap refresh threshold ($V_{TH1}$), the bootstrap refresh module 133 start to operate to reduce the output voltage ($V_{OUT}$) of the voltage converter 200. Meanwhile, the feedback signal (FB) drops with the decreasing of the output voltage ($V_{OUT}$). The comparing module 137 may compare the feedback signal (FB) with the reference voltage signal ($V_{REF}$). When the feedback signal (FB) is smaller than the reference voltage signal ($V_{REF}$), the control module 131 may control the high side switch 11 and the low side switch 12 to switch normally based on the difference signal (EA) so as to maintain the output voltage signal ($V_{OUT}$) at a desired value, i.e. the high side switch 11 and the low side switch 12 are recovered from the off states into a complementary conduction states. The conduction time of the low side switch 12 can be increased accompanying the increasing of the switching frequency of the high side switch 11 and the low side switch 12. Thus, the bootstrap capacitor ($C_B$) can be charged in time so as to refresh the bootstrap voltage signal ($V_{BST}$) to the default value. Decreasing the output voltage ($V_{OUT}$) for increasing the switching frequency of the high side switch 11 and the low side switch 12 by employing a bootstrap refresh module 133 can avoid using a blanking circuit to blank the high side switch 11. Besides, the control method and the switches sequence will not be affected, i.e. the bootstrap voltage ($V_{BST}$) can be refreshed by a normal switching of the high side switch 11 and low side switch 12.

In one embodiment, the bootstrap refresh module 134 may further comprise a second input terminal coupled to the drain of the low side switch 12 for receiving a sensing signal ($V_{CS}$) indicating the reversal current flowing through the low side switch 12.

In one embodiment, still referring to FIG. 3, if the bootstrap voltage ($V_{BST}$) is lower than the bootstrap refresh threshold ($V_{TH1}$), the bootstrap refresh signal (RFS) has a first logic state (e.g. logic high state). The low side switch 12 is turned on in response to the logic high state of the bootstrap refresh signal (RFS) to discharge the capacitor (C) via the inductor (L) and the low side switch 12. Meanwhile, an inverse current flowing through the low side switch 12 increases in accordance with the drops of the output voltage ($V_{OUT}$), while the bootstrap capacitor ($C_B$) is charged via the low side switch 12. When the sensing signal ($V_{CS}$) increases in a default current threshold ($V_P$), the bootstrap refresh signal (RFS) has a second logic state (e.g. logic low state). The low side switch 12 is turned off in response to the logic low state of the bootstrap refresh signal (RFS) to keep the bootstrap capacitor ($C_B$) from charging. The switching circuit 110 is changed from the BUCK topology to a BOOST topology so as to store the energy discharged by the capacitor (C) in the input terminal (IN) of the voltage converter 200 since the current flow through the inductor (L) freewheels via the body diode D1 of the high side switch 11. In one embodiment, the recover value of the bootstrap voltage ($V_{BST}$) is relative to the default current threshold ($V_P$). That is to say, the larger value of the default current threshold ($V_P$), the recovering ability of the bootstrap voltage ($V_{BST}$) is stronger, i.e. the bootstrap voltage ($V_{BST}$) can be refreshed quickly. As a whole, the bootstrap voltage ($V_{BST}$) recovered in this period is limited since conduction time of the low side switch 12 is short. Thus, generally, the value of the default current threshold ($V_P$) will be not set too high. The bootstrap refresh module 134 is configured to decrease the value of the output voltage ($V_{OUT}$). Once the output voltage ($V_{OUT}$) drops lower than the desired value, the control model 131 is configured to start to switch the high side switch 11 and the low side switch 12 on and off until the output voltage ($V_{OUT}$) recovers to the desired value. During this operation, the bootstrap voltage ($V_{BST}$) can also be refreshed to the default value.

In the exemplary embodiment of FIG. 3, the bootstrap refresh module 134 may comprise a first voltage comparator 34 having a first input terminal configured to receive the bootstrap refresh threshold ($V_{TH1}$); a second input terminal configured to receive the bootstrap voltage ($V_{BST}$); and an output terminal. The first voltage comparator 34 is configured to compare the bootstrap voltage ($V_{BST}$) with bootstrap refresh threshold ($V_{TH1}$) for providing a first comparing signal ($A_S$) at the output terminal. In one embodiment, when the bootstrap voltage ($V_{BST}$) is lower than the bootstrap refresh threshold ($V_{TH1}$), the first comparing signal ($A_S$) has a first logic state (e.g. logic high state). When the bootstrap voltage ($V_{BST}$) is larger than the bootstrap refresh threshold ($V_{TH1}$), the first comparing signal ($A_S$) has a second logic state (e.g. logic low state).

In the exemplary embodiment of the present invention, still referring to FIG. 3, the bootstrap refresh module 134 may further comprise a second voltage comparator 35 having a first input terminal configured to receive the default current threshold ($V_P$); a second input terminal configured to receive the sensing signal ($V_{CS}$); and an output terminal. The second voltage comparator 35 is configured to compare the sensing signal ($V_{CS}$) with the default current threshold ($V_P$) for providing a second comparing signal ($A_R$) at the output terminal. In one embodiment, when the sensing signal ($V_{CS}$) is lower than the default current threshold ($V_P$), the second comparing signal ($A_R$) has a first logic state (e.g. logic high state); when the sensing signal ($V_{CS}$) is larger than the default current threshold ($V_P$), the second comparing signal ($A_R$) has a second logic state (e.g. logic low state). In one embodiment, setting the default current threshold ($V_P$) can be based on the desired recovering value of the bootstrap voltage ($V_{BST}$), for example, the larger default current threshold ($V_P$), the larger value of the bootstrap voltage ($V_{BST}$) can be reached.

In the exemplary embodiment of the present invention, still referring to FIG. 3, the bootstrap refresh module 134 may further comprise a logic circuit 36 having a first input terminal configured to receive the first comparing signal ($A_S$); a second input terminal configured to receive the second comparing signal ($A_R$); and an output terminal. Logic circuit 36 is configured to conduct a logic operation to the first comparing signal ($A_S$) and the second comparing signal ($A_R$) for providing the bootstrap refresh signal (RFS) at the output terminal. In one embodiment, the bootstrap refresh signal (RFS) has a first logic state (e.g. logic high state) when the first comparing signal ($A_S$) has a first logic state (e.g. logic high state); the bootstrap refresh signal (RFS) has a second logic state (e.g. logic low state) when the second comparing signal ($A_R$) has a first logic state (e.g. logic high state). In one embodiment, the low side switch 12 is turned on in response to the first logic state of the bootstrap refresh signal (RFS). The capacitor (C) of the switching circuit 110 is discharged via the inductor (L) and the low side switch 12 while the bootstrap capacitor ($C_B$) is charged. The low side switch 12 is turned off in response to the second logic state of the bootstrap refresh signal (RFS) so that the bootstrap capacitor ($C_B$) of the switching circuit 110 stop to discharge while the current flowing through the inductor (L) freewheels via the body diode (D1) of the high side switch 11.

In the exemplary embodiment of FIG. 3, the control module 131 is configured to coupled to the voltage comparing circuit 137 for receiving the difference signal (EA), and configured to provide a first control signal ($S_H$) and a third control signal ($S_{L1}$) to switch the high side switch 11 and the low side switch 12 on and off based on the change of the difference signal (EA). The first control signal ($S_H$) and the third control signal ($S_{L1}$) may have a logic high state and a logic low state respectively. In one embodiment, when the third control signal ($S_{L1}$) is a first logic state (e.g. logic high state), the low side switch 12 is turned on; when the third control signal ($S_{L1}$) is a second logic state (e.g. logic low state), the low side switch 12 is turned off. In one embodiment, the control module 131 may further comprise a logic module 30 having a first input terminal configured to receive the third control signal ($S_{L1}$); a second input terminal configured to receive the bootstrap refresh signal (RFS); and an output terminal. The Logic module 30 is configured to conduct a logic operation to the third control signal ($S_{L1}$) and the bootstrap refresh signal (RFS) for providing a second control signal ($S_L$) at the output terminal. As long as one of the third control signal ($S_{L1}$) and the bootstrap refresh signal (RFS) has a first logic state (e.g. logic high state), the second control signal ($S_L$) has a first logic state (e.g. logic high state) so as to turn the low side switch 12 on. In one exemplary embodiment, the logic module 30 is an OR logic gate.

Figure 4:
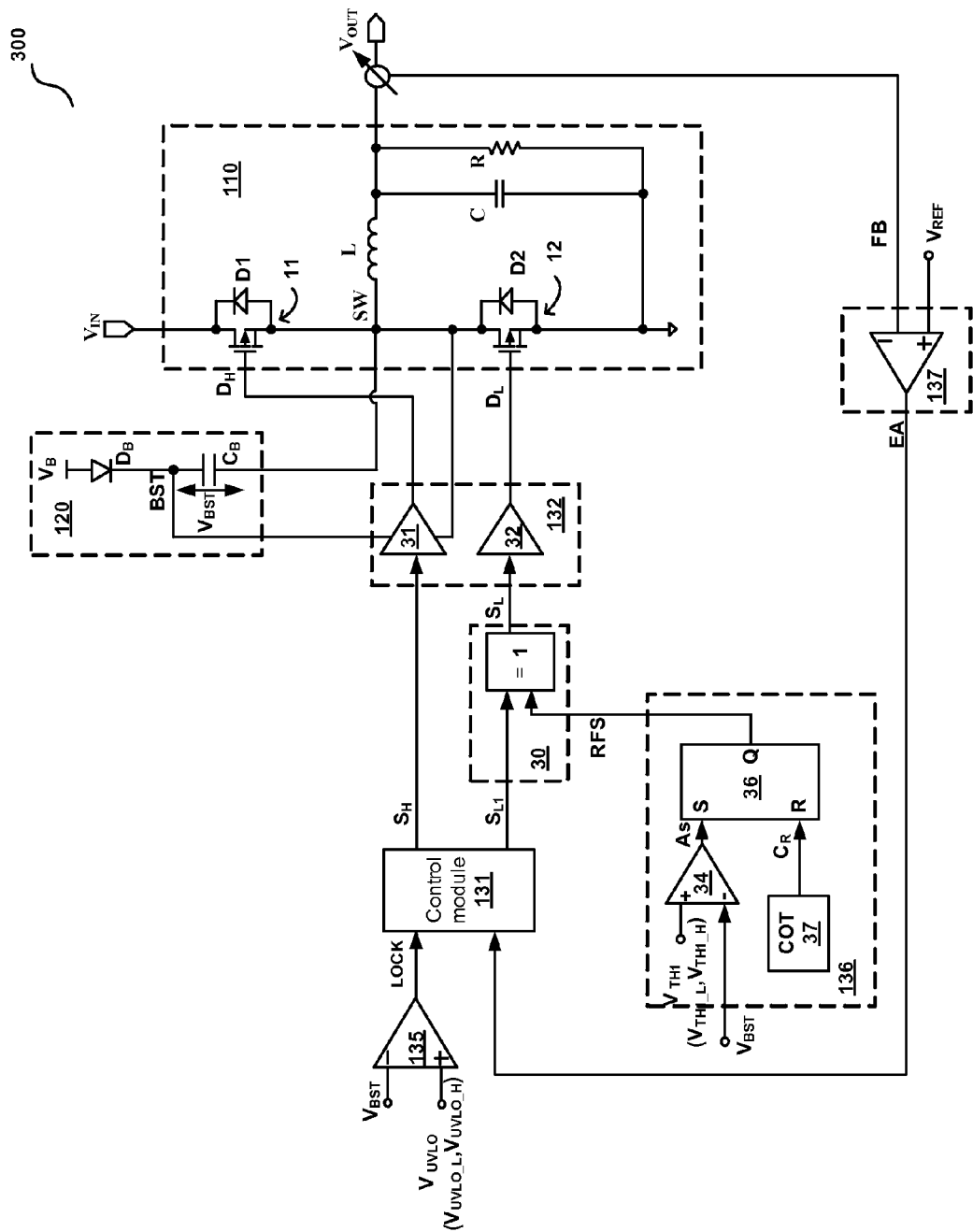
FIG. 4 illustrates a schematic diagram of a voltage converter 300 in accordance with an alternative exemplary embodiment of the present invention.

FIG. 4 illustrates a schematic diagram of a voltage converter 300 in accordance with an exemplary embodiment of the present invention. In the exemplary embodiment of FIG. 4, the voltage converter 300 also comprises a bootstrap refresh control circuit, wherein the bootstrap refresh control circuit may comprise a control module 131, a driving module 132, a comparing module 137, a bootstrap refresh module 136 and a under voltage lock out module 135. To simple and easy to understand, the components or structures in the voltage converter 300 shown in FIG. 4 with substantially same or similar functions as those of the voltage converter 200 shown in FIG. 3 and/or the voltage converter 100 shown in FIG. 2 are identified by the same reference labels.

In one embodiment of the present invention in FIG. 4, the bootstrap refresh module 136 may comprise a first voltage comparator 34 having a first input terminal configured to receive the bootstrap refresh threshold ($V_{TH1}$); a second input terminal configured to receive the bootstrap voltage ($V_{BST}$); and an output terminal. The first voltage comparator 34 is configured to compare the bootstrap voltage ($V_{BST}$) with bootstrap refresh threshold ($V_{TH1}$) for providing a first comparing signal ($A_S$) at the output terminal. In one embodiment, when the bootstrap voltage ($V_{BST}$) is lower than the bootstrap refresh threshold ($V_{TH1}$), the first comparing signal ($A_S$) has a first logic state (e.g. logic high state); when the bootstrap voltage ($V_{BST}$) is larger than the bootstrap refresh threshold ($V_{TH1}$), the first comparing signal ($A_S$) has a second logic state (e.g. logic low state).

In the exemplary embodiment of the present invention, still referring to FIG. 4, the bootstrap refresh module 134 may further comprise a Constant On Time (COT) circuit 37, wherein the COT circuit 37 is configured to provide a COT control signal ($C_R$) having a first logic state (e.g. logic high state) and a second logic state (e.g. logic low state) so as to set a constant on time for the low side switch 12. In one embodiment, the COT control signal ($C_R$) has the first logic state (e.g. logic low state) during the constant on time and has the second logic state (e.g. logic high state) beyond the constant on time.

In the exemplary embodiment of the present invention, still referring to FIG. 3, the bootstrap refresh module 134 may further comprise logic circuit 36 having a first input terminal configured to receive the first comparing signal ($A_S$); a second input terminal configured to receive the COT control signal ($C_R$); and an output terminal. Logic circuit 36 is configured to conduct a logic operation to the first comparing signal ($A_S$) and the COT control signal ($C_R$) for providing the bootstrap refresh signal (RFS) at the output terminal. In one embodiment, the bootstrap refresh signal (RFS) has a first logic state (e.g. logic high state) when the first comparing signal ($A_S$) has a first logic state (e.g. logic high state); and the bootstrap refresh signal (RFS) has a second logic state (e.g. logic low state) when the COT control signal ($C_R$) has a second logic state (e.g. logic high state).

26In one embodiment, the low side switch 12 is turned on in response to the first logic state of the bootstrap refresh signal (RFS). The capacitor (C) of the switching circuit 110 is discharged via the inductor (L) and the low side switch 12 while the bootstrap capacitor ($C_B$) is charged. The low side switch 12 is turned off in response to the second logic state of the bootstrap refresh signal (RFS) so that the bootstrap capacitor ($C_B$) stops to be discharged while the current flowing through the inductor (L) freewheels via the body diode D1 of the high side switch 11. The switching circuit 110 is changed from the BUCK topology to a BOOST topology so as to store the energy discharged by the capacitor (C) in the input terminal (IN) of the voltage converter 300 since the current flow through the inductor (L) freewheels via the body diode D1 of the high side switch 11. In one embodiment, the recover value of the bootstrap voltage ($V_{BST}$) is relative to the conduction time set by the COT circuit 37. That is to say, the longer on time set by the COT circuit 37, the recovering ability of the bootstrap voltage ($V_{BST}$) is stronger, i.e. the bootstrap voltage ($V_{BST}$) can be refreshed quickly. As a whole, the bootstrap voltage ($V_{BST}$) recovered in this period is limited since conduction time of the low side switch 12 is short. Thus, generally, the on time will be not set too long by the COT circuit 37. The bootstrap refresh module 136 is configured to decrease the value of the output voltage ($V_{OUT}$). Once the output voltage ($V_{OUT}$) drops lower than the desired value, the control model 131 is configured to start to switch the high side switch 11 and the low side switch 12 on and off until the output voltage ($V_{OUT}$) recovers to the desired value. During this operation, the bootstrap voltage ($V_{BST}$) can be refreshed to the default value.

Figure 5:
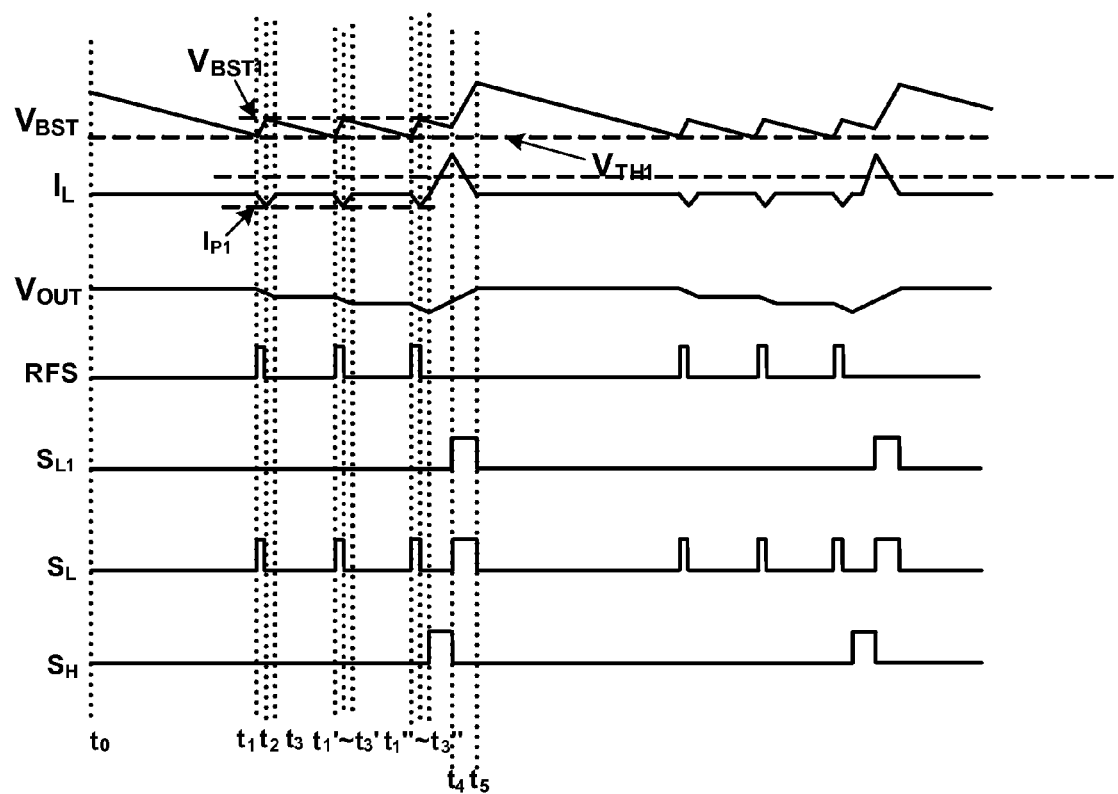
FIG. 5 illustrates an operation waveform diagram of the voltage converter in accordance with an exemplary embodiment of the present invention.

FIG. 5 illustrates an operation waveform diagram of the voltage converter 200 in accordance with an exemplary embodiment of the present invention. In the following, the power converter 200 will be explained in more detail referring to FIG. 3 and FIG. 5. At the time t0, both the first control signal ($S_H$) and the second control signal ($S_L$) are logic low state so that the high side switch 11 and the low side switch 12 are turned off. Thus, the current ($I_L$) flowing through the inductor (L) of the switching circuit 110 is zero.

In the duration of time t0 to t1, both of the first control signal ($S_H$) and the second control signal (SL) keep the logic low state so that the high side switch 11 and the low side switch 12 are still turned off. Thus, the current ($I_L$) flowing through the inductor (L) of the switching circuit 110 is zero. Due to the voltage converter 200 is operated at a light load, the output voltage ($V_{OUT}$) of the voltage converter 200 almost has no change during this period. At the same time, the bootstrap capacitor ($C_B$) of the bootstrap circuit 120 can not be charged due to the off state of the low side switch so that the bootstrap voltage ($V_{BST}$) is dropped.

At the t1 time, the first comparing signal ($A_S$) of the bootstrap refresh circuit is logic high in response to the bootstrap voltage ($V_{BST}$) drops to the bootstrap refresh threshold ($V_{TH1}$) resulting the bootstrap refresh signal (RFS) is logic high. Accordingly, the second control signal ($S_L$) is changed to logic high state so as to turn the low side switch 12 on.

Form time t1 to t2, the second control signal ($S_L$) remains a logic high state so as to keep the low side switch 12 on. The capacitor (C) of the switching circuit 110 is discharged via the inductor (L) and the low side switch 12. The current ($I_L$) flowing through the inductor (L) increases inversely in accordance with the decreasing of the output voltage ($V_{OUT}$). Meanwhile, the bootstrap capacitor ($C_B$) can be charged for refreshing the bootstrap voltage ($V_{BST}$) by connecting to logic ground through the low side switch 12.

At the t2 time, The current ($I_L$) flowing through the inductor (L) increases to a first current threshold ($I_{P1}$), i.e. the current sensing signal ($V_{CS}$) of the second comparator 35 is equal to the default current threshold ($V_P$) in the bootstrap refresh circuit 134, that is to day, the first current threshold signal ($I_{P1}$) is indicative of the default current threshold ($V_P$). At this time, the second comparing signal ($A_R$) changes to a logic high state so as to turn the low side switch 12 off. Accordingly, the bootstrap voltage signal ($V_{BST}$) can be refreshed to a first value ($V_{BST1}$). In other embodiments, different value of the default current threshold ($V_P$) can be chosen for a purpose of getting different refreshed value of the bootstrap voltage signal ($V_{BST}$). Without doubt that in the exemplary embodiment of the voltage converter 300 in FIG. 4, different refreshed value of the bootstrap voltage signal ($V_{BST}$) can be abstained by setting different on time of the COT circuit 37.

Continue to FIG. 5, Form time t2 to t3, the second control signal ($S_L$) backs to the logic low state so that the output voltage signal ($V_{OUT}$) of voltage converter 200 continues to drop. Accordingly, the current ($I_L$) flow through the inductor (L) freewheels via the body diode D1 of the high side switch 11.

At the time t3, the current ($I_L$) flowing through the inductor (L) decreases to zero.

The durations of time t1' to t3' and the time t1" to t3" are repeated of the above process of time t1 to t3. The output voltage signal ($V_{OUT}$) of voltage converter 200 continues to drop. In one embodiment, for example, in time T3", the output voltage signal ($V_{OUT}$) drops to a reference value, the voltage converter 200 jumps out of a light load condition so that the high side switch 11 and the low side switch 12 start to switch on and off normally. At this moment, the first control signal ($S_H$) changes to a logic high state so as to turn the high side switch 11 on. It should be understood that, in the exemplary embodiment of FIG. 5, the low side switch 12 has been switched on and off three times (i.e. t1-t3, t1'-t3', and t1"-t3") for the purpose of decreasing the output voltage ($V_{OUT}$). In other embodiment, any switching times can be chosen for a different reference value.

From time t3" to t4, the high side switch 11 keeps on state in response to the logic high state of the first control signal ($S_H$). The output voltage ($V_{OUT}$) increases in accordance with the inductor (L) store energies forward. At the same time, the bootstrap voltage ($V_{BST}$) continues to drop down.

At the time t4, the high side switch 11 is turned off in response to the logic low state of the first control signal ($S_H$). Inversely, the low side switch 12 is turned on in response to the logic high state of the second control signal ($S_L$). Meanwhile, the inductive current ($I_L$) gets to a peak value.

From time t4 to t5, the high side switch 11 keeps off state and the low side switch 12 keeps on state. The current ($I_L$) flowing through the inductor (L) freewheels via the low side switch 12. The bootstrap capacitor ($C_B$) can be charged for refreshing the bootstrap voltage ($V_{BST}$) by connecting to logic ground through the low side switch 12.

At the time t5, the high side switch 11 is turned off in response to the logic low state of the second control signal ($S_L$). The current ($I_L$) flowing through the inductor (L) is dropped to zero while the bootstrap voltage ($V_{BST}$) is refreshed.

Figure 6:
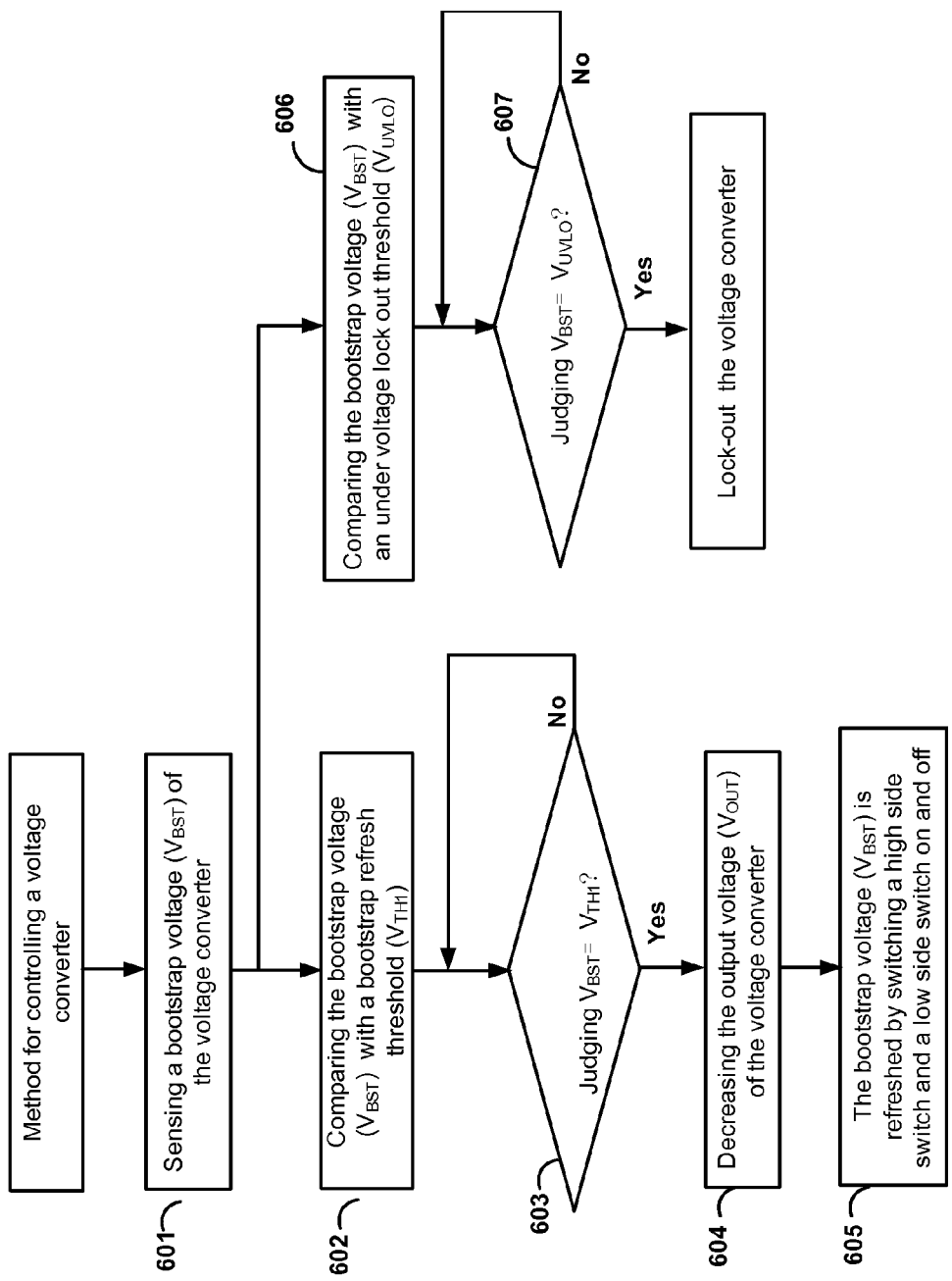
FIG. 6 illustrates a flow diagram of a method for controlling a voltage converter in accordance with an exemplary embodiment of the present invention.

FIG. 6 illustrates a flow diagram of a method for controlling a voltage converter in accordance with an exemplary embodiment of the present invention.

The voltage converter (such as the voltage converters 100, 200, and 300) may comprise a high side switch (e.g. 11 in FIGS. 2, 3 and 4), a low side switch (e.g. 12 in FIGS. 2, 3 and 4) and a bootstrap capacitor (e.g. $C_B$ in FIGS. 2 and 3) for providing a bootstrap voltage (e.g. $V_{BST}$) to supply a high side driver of the high side switch. The power converter is configured to receive an input voltage ($V_{IN}$) and to provide an output voltage ($V_{OUT}$) based on driving the high side switch and the low side switch to switch on and off according to the output voltage and the output current. The method for controlling the power converter may comprise step 601 to step 607.

In step 601, sensing the bootstrap voltage of a voltage converter (such as the voltage converters 100, 200, and 300) across the bootstrap capacitor ($C_B$) so as to generate a bootstrap voltage signal ($V_{BST}$).

In step 602, comparing the bootstrap voltage signal ($V_{BST}$) with a bootstrap refresh threshold ($V_{TH1}$) to provide a first comparing signal ($A_S$) based on the comparison results of the bootstrap voltage signal ($V_{BST}$) and the bootstrap refresh threshold ($V_{TH1}$), wherein the first comparing signal ($A_S$) has a first logic state and a second logic state, and wherein the first comparing signal ($A_S$) has the first logic state when the bootstrap voltage signal ($V_{BST}$) is lower than the bootstrap refresh threshold ($V_{TH1}$), and wherein the first comparing signal ($A_S$) has the second logic state when the bootstrap voltage signal ($V_{BST}$) is larger than the bootstrap refresh threshold ($V_{TH1}$).

In step 603, Determining whether the bootstrap voltage signal ($V_{BST}$) is smaller than the bootstrap refresh threshold ($V_{TH1}$) or not. If the bootstrap voltage signal ($V_{BST}$) drops to the bootstrap refresh threshold ($V_{TH1}$), thus the control method turns to step 604. Otherwise, the control method returns to the step 602 to continue to compare the bootstrap voltage signal ($V_{BST}$) with a bootstrap refresh threshold ($V_{TH1}$).

Continue with FIG. 6, in step 604, decreasing the output voltage signal ($V_{OUT}$) of the voltage converter once the bootstrap voltage signal ($V_{BST}$) drops to the bootstrap refresh threshold ($V_{TH1}$).

In step 605, the high side switch 11 and the low side switch 12 are switched on and off in response to the decreasing of output voltage signal ($V_{OUT}$) so as to maintain the output voltage signal ($V_{OUT}$) at a desirable value. The bootstrap voltage signal ($V_{BST}$) can be refreshed once the switching frequency of the low side switch 12 gets faster.

In accordance with an exemplary embodiment of the present invention, the method for controlling the power converter may further comprise step 606 and step 607.

In step 606, comparing the bootstrap voltage signal ($V_{BST}$) with an under voltage lock out threshold ($V_{UVLO}$) so as to provide a bootstrap under voltage signal (LOCK) based on the comparison of the bootstrap voltage signal ($V_{BST}$) and the under voltage lock out threshold ($V_{UVLO}$), wherein the under voltage lock out threshold ($V_{UVLO}$) is smaller than the bootstrap refresh threshold ($V_{TH1}$). When the bootstrap voltage signal ($V_{BST}$) is smaller than the under voltage lock out threshold ($V_{UVLO}$), the bootstrap under voltage signal (LOCK) may have a first logic state (e.g. logic high state). When the bootstrap voltage signal ($V_{BST}$) is larger than the under voltage lock out threshold ($V_{UVLO}$), the bootstrap under-voltage signal (LOCK) may have a second logic state (e.g. logic low state).

Continue with FIG. 6, in step 607, switching the high side switch 11 and the low side switch 12 on and off based on the logic state of the bootstrap under-voltage signal (LOCK). When the bootstrap under-voltage signal (LOCK) has a first logic state (e.g. logic high state), both of the high side switch 11 and the low side switch 12 stop switching on and off (e.g., turn the high side switch 11 and the low side switch 12 off). When the bootstrap voltage signal ($V_{BST}$) is larger than the under-voltage lock-out threshold ($V_{UVLO}$), the bootstrap under-voltage signal (LOCK) has a second logic state (e.g. logic low state), and the high side switch 11 and the low side switch 12 can be switched on and off based on the difference signal (EA).

In accordance with an exemplary embodiment of the present invention, in step 604, the high side switch and the low side switch have a common connection node, and decreasing the output voltage signal ($V_{OUT}$) of the voltage converter may comprise using a resistor or a current sink connected between the output terminal (OUT) of the voltage converter and the logic ground GND to discharge the capacitor (C). In other embodiment, the voltage converter may comprise a common connection node (SW) of the high side switch 11 and the low side switch 12. Decreasing the output voltage signal ($V_{OUT}$) of the voltage converter may comprise using a resistor or a current sink connected between common connection node (SW) and the logic ground GND to discharge the output capacitor (C).

In accordance with an exemplary embodiment of the present invention, in step 604, decreasing the output voltage signal ($V_{OUT}$) of the voltage converter may comprise: sensing the current flowing through the low side switch 12 so as to provide a sensing signal ($V_{CS}$); comparing the sensing signal ($V_{CS}$) with a default current threshold ($V_P$) so as to provide a second comparing signal ($A_R$), wherein the second comparing signal ($A_R$) has a first logic state and a second logic state, wherein the second comparing signal ($A_R$) has the first logic state when the sensing signal ($V_{CS}$) is larger than the default current threshold, and wherein the second comparing signal ($A_R$) has the second logic state when the sensing signal ($V_{CS}$) is lower than the default current threshold; providing a bootstrap refresh signal (RFS) based on the first comparing signal ($A_S$) and the second comparing signal ($A_R$), wherein the a bootstrap refresh signal (RFS) has a first logic state and a second logic state, wherein the bootstrap refresh signal (RFS) has the first logic state when the first comparing signal ($A_S$) has a first logic state, and wherein the bootstrap refresh signal (RFS) has the second logic state when the second comparing signal ($A_R$) has the first logic state; switching the low side switch 12 on and off based on the bootstrap refresh signal (RFS) so as to decrease the output voltage ($V_{OUT}$). In one embodiment, the low side switch 12 is turned on in response to the first logic state of the bootstrap refresh signal (RFS) when the first comparing signal ($A_S$) has a first logic state (e.g. logic high state); the low side switch 12 is turned off in response to the second logic state of the bootstrap refresh signal (RFS) when the second comparing signal ($A_R$) has a first logic state (e.g. logic high state).

In accordance with an exemplary embodiment of the present invention, in step 604, decreasing the output voltage signal ($V_{OUT}$) of the voltage converter may comprise: providing a Constant On Time control signal ($C_R$) configured to set a constant on time for the low side switch 12, wherein the Constant On Time control signal ($C_R$) has a first logic state and a second logic state, wherein the Constant On Time control signal ($C_R$) has the first logic state during the constant on time, and wherein the Constant On Time control signal ($C_R$) has the second logic state beyond the constant on time; providing a bootstrap refresh signal (RFS) based on the first comparing signal ($A_S$) and the Constant On Time control signal ($C_R$), wherein the a bootstrap refresh signal (RFS) has a first logic state and a second logic state, wherein the bootstrap refresh signal (RFS) has the first logic state when the first comparing signal ($A_S$) has a first logic state, and wherein the bootstrap refresh signal ($A_S$) has the second logic state when the Constant On Time control signal ($C_R$) has a second logic state; switching the low side switch 12 on and off based on the bootstrap refresh signal (RFS) so as to decrease the output voltage ($V_{OUT}$). In one embodiment, the low side switch 12 is turned on in response to the first logic state of the bootstrap refresh signal (RFS) when the first comparing signal ($A_S$) has a first logic state (e.g. logic high state); the low side switch 12 is turned off in response to the second logic state of the bootstrap refresh signal (RFS) when COT control signal ($C_R$) has a second logic state (e.g. logic high state).

Methods and steps of controlling the power converter described above in the various embodiments of the present invention are illustrative and not intended to be limiting. Well known controlling steps, operating processes, and parameters etc. are not described in detail to avoid obscuring aspects of the invention. Those skilled in the art should understand that the steps described in the embodiments with reference to FIG. 6 may be implemented in different orders and are not limited to the embodiments described.

Although a bootstrap refresh control circuit, a power converter comprising the bootstrap refresh control circuit and associated control methods are illustrated and explained based on a buck type power converter according to various embodiments of the present invention, this is not intended to be limiting. Persons of ordinary skill in the art will understand that the circuits, methods and principles taught herein may apply to any other suitable types of power converters, such as boost type power converters, buck-boost type power converters or flyback type power converters etc.

From the foregoing, it will be appreciated that specific embodiments of the present invention have been described herein for purposes of illustration, but that various modifications may be made without deviating from the spirit and scope of various embodiments of the present invention. Many of the elements of one embodiment may be combined with other embodiments in addition to or in lieu of the elements of the other embodiments. Accordingly, the present invention is not limited except as by the appended claims.

What is claimed is:

1. A bootstrap refresh control circuit for a voltage converter, wherein the voltage converter comprises a high side switch, a low side switch and a bootstrap capacitor for providing a bootstrap voltage signal to supply a high side driver of the high side switch, and wherein the voltage converter is configured to receive an input voltage at an input terminal and to provide an output voltage at an output terminal based on driving the high side switch and the low side switch to switch on and off, and wherein the bootstrap refresh control circuit comprising:

a bootstrap refresh module, wherein the bootstrap refresh module comprises a first comparing module having a first input terminal, a second input terminal and an output terminal, and wherein the first input terminal of the first comparing module is configured to receive the bootstrap voltage signal, the second input terminal of the first comparing module is configured to receive a bootstrap refresh threshold, and the first comparing module is configured to compare the bootstrap voltage signal with the bootstrap refresh threshold to provide a first comparing signal having a first logic state and a second logic state at the output terminal, and wherein the first comparing signal has the first logic state when the bootstrap voltage signal is lower than the bootstrap refresh threshold, and wherein the first comparing signal has the second logic state when the bootstrap voltage signal is larger than the bootstrap refresh threshold; and a voltage difference module having a first input terminal, a second input terminal and an output terminal, wherein the first input terminal of the voltage difference module is configured to receive a feedback signal representing the output voltage of the voltage converter, the second input terminal of the voltage difference module is configured to receive a reference voltage signal representing a desired value of the output voltage of the voltage converter, the voltage difference module is configured to compare the feedback signal with the reference voltage signal so as to provide a difference signal at the output terminal; and wherein when the first comparing signal has the first logic state, the bootstrap refresh module is configured to decrease the output voltage of the voltage converter; and wherein when the feedback signal is smaller than the reference voltage signal, the bootstrap refresh control circuit is configured to control the high side switch and the low side switch to switch on and off based on the difference signal so as to charge the bootstrap capacitor for refreshing the bootstrap voltage signal.

2. The bootstrap refresh control circuit of claim 1, wherein the bootstrap refresh threshold comprises a first threshold and a second threshold, wherein the first threshold is higher than a ground potential and lower than the second threshold; and wherein
the first comparing signal has the first logic state when the bootstrap voltage signal is lower than the first threshold, and wherein the first comparing signal has the second logic state when the bootstrap voltage signal is larger than the second threshold.

3. The bootstrap refresh control circuit of claim 1, wherein the high side switch and the low side switch have a common connection node, and wherein the bootstrap refresh module further comprises a discharging switch and a resistor, and wherein
the discharging switch has a first terminal, a second terminal and a control terminal, wherein the first terminal of the discharging switch is connected to the common connection node and/or the output terminal of the voltage converter so as to provide a bootstrap refresh signal, the second terminal of the discharging switch is coupled to one terminal of the resistor, the control terminal of the discharging switch is configured to receive the first comparing signal, and the another terminal of the resistor is connected to the logic ground; and wherein
when the first comparing signal has the first logic state, the discharging switch is turned on so as to connect the resistor to the common connection node and/or the output terminal of the voltage converter for decreasing the output voltage of the voltage converter; and
when the first comparing signal has the second logic state, the discharging switch is turned off for disconnecting the resistor from the common connection node and/or the output terminal of the voltage converter.

4. The bootstrap refresh control circuit of claim 3, wherein the bootstrap refresh module further comprises:
a control module comprising an input terminal, a first output terminal and a second output terminal, wherein the input terminal of the control module is coupled to the output terminal of the voltage difference module for receiving the difference signal, the control module is configured to provide a first control signal and a second control signal based on the difference signal for switching the high side switch and the low side switch on and off at the first output terminal and the second output terminal respectively;
and wherein when the feedback signal is smaller than the reference voltage signal, the control module is configured to control the high side switch and the low side switch to switch on and off based on the difference signal so as to charge the bootstrap capacitor for refreshing the bootstrap voltage signal.

5. The bootstrap refresh control circuit of claim 1, wherein the bootstrap refresh module further comprises:
a second comparing module having a first input terminal, a second input terminal and an output terminal, wherein the first input terminal of the second comparing module is configured to receive a default current threshold, the second input terminal of the second comparing module is configured to receive a sensing signal representing the current flowing through the low side switch, and the second comparing module is configured to compare the sensing signal with the default current threshold for providing a second comparing signal having a first logic state and a second logic state at the output terminal, and wherein the second comparing signal has the first logic state when the sensing signal is larger than the default current threshold, and wherein the second comparing signal has the second logic state when the sensing signal is lower than the default current threshold; and
a first logic module having a first input terminal, a second input terminal and an output terminal, wherein the first input terminal of the first logic module is configured to receive the first comparing signal, the second input terminal of the first logic module is configured to receive the second comparing signal, and the first logic module is configured to conduct a logic operation to the first comparing signal and the second comparing signal for providing a bootstrap refresh signal having a first logic state and a second logic state at the output terminal; and wherein
the bootstrap refresh signal has the first logic state when the first comparing signal has a first logic state so as to turn the low side switch on, and the bootstrap refresh signal has the second logic state when the second comparing signal has a first logic state so as to turn the low side switch off.

6. The bootstrap refresh control circuit of claim 1, wherein the bootstrap refresh module further comprises:
a Constant On Time circuit configured to provide a COT control signal having a first logic state and a second logic state so as to set a constant on time for the low side switch, wherein the COT control signal has the first logic state during the constant on time, and wherein the COT control signal has the second logic state beyond the constant on time; and
a first logic module having a first input terminal, a second input terminal and an output terminal, wherein the first input terminal of the first logic module is configured to receive the first comparing signal, the second input terminal of the first logic module is configured to receive the COT control signal, and the first logic module is configured to conduct a logic operation to the first comparing signal and the COT control signal for providing a bootstrap refresh signal having a first logic state and a second logic state at the output terminal; and wherein
the bootstrap refresh signal has the first logic state when the first comparing signal has a first logic state so as to turn the low side switch on, and the bootstrap refresh signal has a second logic state when the COT control signal has a second logic state so as to turn the low side switch off.

7. The bootstrap refresh control circuit of claim 1 further comprising:
an under voltage lock out module having a first input terminal, a second input terminal and an output terminal, wherein the first input terminal of the under voltage lock out module is configured to receive the bootstrap voltage signal, the second input terminal of the under voltage lock out module is configured to receive an under voltage lock out threshold, and the under voltage lock out module is configured to compare the bootstrap voltage signal with the under voltage lock out threshold so as to provide a bootstrap under voltage signal having a first logic state and a second logic state at the output terminal, and wherein the bootstrap refresh signal has the first logic state when the bootstrap voltage signal is lower than the under voltage lock out threshold so as to stop switching the high side switch and the low side switch, and wherein the bootstrap refresh signal has the second logic state when the bootstrap voltage signal is larger than the under voltage lock out threshold so as to permit switching the high side switch and the low side switch.

8. The bootstrap refresh control circuit of claim 5 further comprising:
a control module having a first input terminal, a second input terminal, a first output terminal and a second output terminal, wherein the first input terminal of the control module is coupled to the output terminal of the voltage difference module for receiving the difference signal, the second input terminal of the control module is configured to receive the bootstrap refresh signal, the control module is configured to conduct a logic operation of difference signal and the bootstrap refresh signal for providing a first control signal and a second control signal to switch the high side switch and the low side switch on and off at the first output terminal and the second output terminal respectively, and wherein the first control signal and the second control signal both have a first logic state and a second logic state; and wherein
when the feedback signal is smaller than the reference voltage signal, the high side switch is turned on in response to the first logic state of the first control signal, and the low side switch is turned off in response to the second logic state of the second control signal; and wherein
when the feedback signal is larger than the reference voltage signal, the high side switch is turned off in response to the second logic state of the first control signal, and the low side switch is turned on in response to the first logic state of the second control signal; and wherein
when the bootstrap refresh signal has the first logic state, the second control signal has the first logic state so as to turn the low side switch on for decreasing the output voltage of the voltage converter; when the bootstrap refresh signal has the second logic state, the second control signal has the second logic state so as to turn the low side switch off.

9. The bootstrap refresh control circuit of claim 6 further comprising:
a control module having a first input terminal, a second input terminal, a first output terminal and a second output terminal, wherein the first input terminal of the control module is coupled to the output terminal of the voltage difference module for receiving the difference signal, the second input terminal of the control module is configured to receive the bootstrap refresh signal, the control module is configured to conduct a logic operation of difference signal and the bootstrap refresh signal for providing a first control signal and a second control signal to switch the high side switch and the low side switch on and off at the first output terminal and the second output terminal respectively, and wherein the first control signal and the second control signal both have a first logic state and a second logic state; and wherein
when the feedback signal is smaller than the reference voltage signal, the high side switch is turned on in response to the first logic state of the first control signal, and the low side switch is turned off in response to the second logic state of the second control signal; and wherein
when the feedback signal is larger than the reference voltage signal, the high side switch is turned off in response to the second logic state of the first control signal, and the low side switch is turned on in response to the first logic state of the second control signal; and wherein
when the bootstrap refresh signal has the first logic state, the second control signal has the first logic state so as to turn the low side switch on for decreasing the output voltage of the voltage converter; when the bootstrap refresh signal has the second logic state, the second control signal has the second logic state so as to turn the low side switch off.

10. The bootstrap refresh control circuit of claim 8, wherein the bootstrap refresh control circuit further comprising:
a driver module comprising a first driver and a second driver, wherein the first driver has an input terminal configured to receive the first control signal, a first supply terminal configured to receive the bootstrap voltage signal, a second supply terminal connected to the common connection node, and an output terminal configured to provide a first drive signal to drive the high side switch on and off; and wherein the second driver has an input terminal configured to receive the second control signal, and an output terminal configured to provide a second drive signal to drive the low side switch on and off.

11. A voltage converter, comprising:
a switching circuit having a high side switch and a low side switch, wherein the switching circuit is configured to receive an input voltage, and further configured to provide an output voltage based on switching the high side switch and the low side switch on and off;
a bootstrap circuit comprising a bootstrap capacitor, wherein the bootstrap capacitor is charged for providing a bootstrap voltage signal for the high side switch; and
a bootstrap refresh control circuit comprising:
  a bootstrap refresh module, wherein the bootstrap refresh module comprises a first comparing module having a first input terminal, a second input terminal and an output terminal, and wherein the first input terminal of the first comparing module is configured to receive the bootstrap voltage signal, the second input terminal of the first comparing module is configured to receive a bootstrap refresh threshold, and the first comparing module is configured to compare the bootstrap voltage signal with the bootstrap refresh threshold to provide a first comparing signal having a first logic state and a second logic state at the output terminal, and wherein the first comparing signal has the first logic state when the bootstrap voltage signal is lower than the bootstrap refresh threshold, and the first comparing signal has the second logic state when the bootstrap voltage signal is larger than the bootstrap refresh threshold; and
  a voltage difference module having a first input terminal, a second input terminal and an output terminal, wherein the first input terminal of the voltage difference module is configured to receive a feedback signal representing the output voltage of the voltage converter, the second input terminal of the voltage difference module is configured to receive a reference voltage signal representing a desired value of the output voltage of the voltage converter, the voltage difference module is configured to compare the feedback signal with the reference voltage signal so as to provide a difference signal at the output terminal; and wherein
    when the first comparing signal has the first logic state, the bootstrap refresh module is configured to decrease the output voltage of the voltage converter; and wherein when the feedback signal is smaller than the reference voltage signal, the bootstrap refresh control circuit is configured to control the high side switch and the low side switch to switch on and off based on the difference signal so as to charge the bootstrap capacitor for refreshing the bootstrap voltage signal.

12. A bootstrap refresh control method for a voltage converter, wherein the voltage converter comprises a high side switch, a low side switch and a bootstrap capacitor for providing a bootstrap voltage signal to supply a high side driver of the high side switch, and wherein the voltage converter is configured to receive an input voltage and to provide an output voltage based on driving the high side switch and the low side switch to switch on and off, and wherein the bootstrap refresh control method comprising:
sensing the bootstrap voltage signal of the voltage converter;
comparing the bootstrap voltage with a bootstrap refresh threshold to provide a first comparing signal, wherein the first comparing signal has a first logic state and a second logic state, and wherein the first comparing signal has the first logic state when the bootstrap voltage is lower than the bootstrap refresh threshold, and wherein the first comparing signal has the second logic state when the bootstrap voltage signal is larger than the bootstrap refresh threshold;
determining whether the bootstrap voltage signal is smaller than the bootstrap refresh threshold or not; and
decreasing the output voltage of the voltage converter by a bootstrap refresh circuit once the bootstrap voltage signal is determined to have dropped to be smaller than the bootstrap refresh threshold; and wherein
  when the output voltage of the voltage converter is decreased, switching the high side switch and the low side switch on and off so as to refresh the bootstrap voltage signal.

13. The bootstrap refresh control method of claim 12, wherein the high side switch and the low side switch have a common connection node, and wherein decreasing the output voltage of the voltage converter by a bootstrap refresh circuit comprises:
when the bootstrap voltage signal is smaller than the bootstrap refresh threshold, a resistor and/or a current sink is connected between the common connection node and a logic ground and/or between an output terminal of the voltage converter and the logic ground.

14. The bootstrap refresh control method of claim 12, wherein decreasing the output voltage of the voltage converter by a bootstrap refresh circuit comprises:
sensing a current flowing through the low side switch so as to provide a sensing signal;
comparing the sensing signal with a default current threshold so as to provide a second comparing signal, wherein the second comparing signal has a first logic state and a second logic state, and wherein the second comparing signal has the first logic state when the sensing signal is larger than the default current threshold, and wherein the second comparing signal has the second logic state when the sensing signal is lower than the default current threshold;
providing a bootstrap refresh signal based on the first comparing signal and the second comparing signal, wherein the bootstrap refresh signal has a first logic state and a second logic state, and wherein the bootstrap refresh signal has the first logic state when the first comparing signal has the first logic state, and wherein the bootstrap refresh signal has the second logic state when the second comparing signal has the first logic state; and
switching the low side switch on and off based on the bootstrap refresh signal so as to decrease the output voltage; and wherein
  the low side switch is switched on in response to the first logic state of the bootstrap refresh signal; and wherein
  the low side switch is switched off in response to the second logic state of the bootstrap refresh signal.

15. The bootstrap refresh control method of claim 12, wherein decreasing the output voltage of the voltage converter by a bootstrap refresh circuit comprising:
   providing a Constant On Time control signal to set a constant on time for the low side switch, wherein the Constant On Time control signal has a first logic state and a second logic state, and wherein the Constant On Time control signal has the first logic state during the constant on time, and wherein the Constant On Time control signal has the second logic state beyond the constant on time;
   providing a bootstrap refresh signal based on the first comparing signal and the constant on time control signal, wherein the bootstrap refresh signal has a first logic state and a second logic state, and wherein the bootstrap refresh signal has the first logic state when the first comparing signal has the first logic state, and wherein the bootstrap refresh signal has the second logic state when the Constant On Time control signal has the second logic state; and
   switching the low side switch on and off based on the bootstrap refresh signal so as to decrease the output voltage; and wherein
      the low side switch is switched on in response to the first logic state of the bootstrap refresh signal; and wherein
      the low side switch is switched off in response to the second logic state of the bootstrap refresh signal.

16. The bootstrap refresh control circuit of claim 12, wherein
   the bootstrap refresh threshold comprises a first threshold and a second threshold, and wherein the first threshold is higher than a ground potential and lower than the second threshold; and wherein
   the first comparing signal has the first logic state when the bootstrap voltage signal is lower than the first threshold, and wherein the first comparing signal has the second logic state when the bootstrap voltage signal is higher than the second threshold.

* * * * *